United States Patent [19]

Schlipf et al.

[11] Patent Number: 4,776,271

[45] Date of Patent: Oct. 11, 1988

[54] SILK-SCREEN PRINTING METHOD USING PREDISTORTED SECOND SCREEN

[75] Inventors: Michael Schlipf, Ulm; Kurt M. Tischer, Wendlingen; Klaus-Peter Voigt, Esslingen, all of Fed. Rep. of Germany

[73] Assignee: Standard Elektrik Lorenz AG, Stuttgart, Fed. Rep. of Germany

[21] Appl. No.: 860,364

[22] Filed: May 6, 1986

[51] Int. Cl.⁴ .............................................. B41M 1/12
[52] U.S. Cl. ..................................... 101/129; 118/213
[58] Field of Search ................. 101/129, 128.4, 127.1, 101/127; 118/213, 301

[56] References Cited

U.S. PATENT DOCUMENTS

| | | | |
|---|---|---|---|
| 1,858,786 | 5/1932 | Myers. | |
| 3,158,077 | 11/1964 | Miller et al. | 95/73 |
| 3,230,822 | 1/1966 | Wanielista | 88/24 |
| 3,987,725 | 10/1976 | Scantlin | 101/128.4 |
| 4,041,861 | 8/1977 | Alter | 101/127.1 |
| 4,129,076 | 12/1978 | Gardner | 101/127.1 |
| 4,193,344 | 3/1980 | Ericsson | 101/126 |
| 4,516,495 | 5/1985 | Ericsson | 101/129 |

FOREIGN PATENT DOCUMENTS

| | | | |
|---|---|---|---|
| 1154327 | 9/1963 | Fed. Rep. of Germany. | |
| 102768 | 6/1983 | Japan | 101/127.1 |
| 912168 | 12/1962 | United Kingdom. | |

Primary Examiner—E. H. Eickholt
Attorney, Agent, or Firm—Christie, Parker & Hale

[57] ABSTRACT

During silk-screen printing, the stencil (3) is stretched as a result of the pressure exerted by the squeeges (6) This results in a distorted pattern on the material (4) to be printed. To eliminate this error, the design (7') in the stencil (3) is predistorted in such a way that a distortion-free printed pattern (8') is obtained.

1 Claim, 1 Drawing Sheet

SILK-SCREEN PRINTING METHOD USING PREDISTORTED SECOND SCREEN

TECHNICAL FIELD

The present invention relates to a silk-screen printing apparatus.

BACKGROUND ART

German Patent Publication DE-OS No. 27 43 234 (corresponding to U.S. Pat. No. 4,193,344 "Silk/Screen Printing Machine" in the name of S J D Ericsson) discloses a silk-screen printing machine in which the stencil is located slightly above the material to be printed when the machine is at rest. As the stencil is stretched during printing, a geometric printing error would normally be expected to result. This error is eliminated by imparting movement to the stencil or the printing surface relative to the material to be printed, this movement being opposite to that of the squeegee. This requires a mechanism which adds to the complication of the silk-screen printing machine.

DISCLOSURE OF INVENTION

The object of the invention is to provide a simpler silk-screen printing apparatus which corrects the error caused by the stretch in the stencil during printing. To achieve this, the design in the stencil is predistorted in such a way that a distortion-free printed pattern is obtained.

BRIEF DESCRIPTION OF DRAWING(S)

An embodiment of the invention will now be explained with reference to the accompanying Drawing, in which.

BEST MODE(S) FOR CARRYING OUT THE INVENTION

Figure 1:
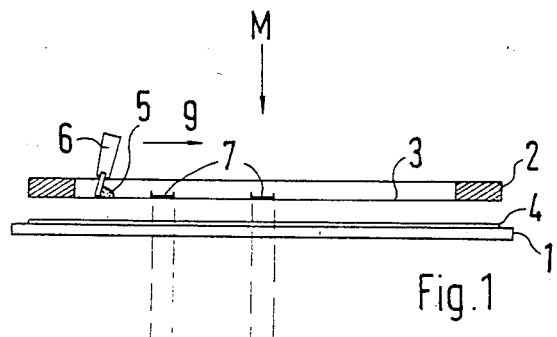
FIG. 1 is a schematic side view of a conventional printing apparatus in the rest position.

The silk-screen printing apparatus shown in FIG. 1 comprises a substrate 1 and, above the latter at the usual distance, a frame 2 with a stencil 3 mounted therein. The frame 2 is shown in section in the figures. The substrate 1 supports the material 4 to be printed. During printing, a squeegee 6 is moved over the stencil 3 in the direction of the arrow 9, forcing the coloring matter 5 onto the material 4 in accordance with the design 7 in the stencil 3. For simplicity, the design 7 in FIG. 1 consists of squares at different points of the stencil 3. The center of the silk-screen printing apparatus is marked by the arrow M.

Figure 2:
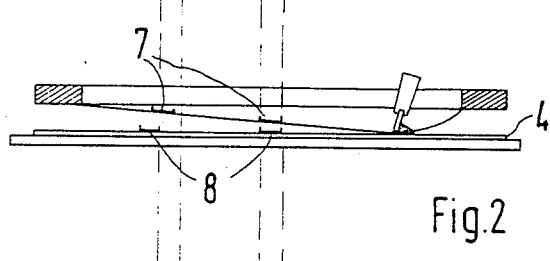
FIG. 2 shows the printing apparatus of FIG. 1 in the working position.

In FIG. 2, the silk-screen printing apparatus is shown nearly at the end of the printing process. As the stencil 3 is stretched during printing, displaced and distortd images of the design 7 are formed on the material 4 to be printed. These displacemet and distortion errors differ in amount at each point and do not exist at the center of the stencil. They are partly calculable. The design 7 is also displaced and distorted transverse to the movement of the squeegee.

To obtain an error-free image 8 of the design in the stencil 3 on the material 4 to be printed, the design in the stencil must be predistorted in accordance with the stretch in the stencil during printing.

Figure 3:
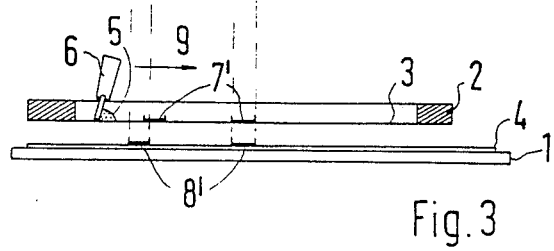
FIG. 3 is a schematic side view of a printing apparatus used in accordance with the invention.

FIG. 3 shows the silk-screen printing apparatus according to the invention with a suitably predistorted design 7' in the stencil 3. The squares of the design have been shifted by suitable amounts. The image formed on the material 4 to be printed is designated 8' and lies exactly at the desired points.

In this example, the predistortion of the design 7' in the stencil 3 in accordance with the stretch in the stencil during printing was considered in the direction of movement of the squeegee. In most cases, such a predistortion of the design is also necessary in the transverse direction. To circumvent or supplement the calculation of such predistortions, a print is made with a stencil having an undistorted design, and the errors are measured. On the basis of the measured errors, the design in the final stencil may then be predistorted. From a comparison of FIG. 3 with FIG. 2, it will be seen that the intentionally introduced distortion error in the predistorted stencil should be complementary to the measured distortion error.

The printed material 4 may be subjected to deformation in one or more subsequent treatments, so that the printed pattern may change. Such changes, too, can be measured and additionally taken into account when predistorting the design in the stencil 3.

We claim:

1. A method of silk screening an undistorted design on an object to be printed by means of a squeegee and a stencil, said method comprising:
   (a) perforating a first stencil with an undistorted design;
   (b) using said first stencil in combination with a conventional silk-screen printing apparatus to print said design on said object;
   (c) measuring the distortion error between said undistorted design perforated in said first stencil in step (a) and the distorted design printed on said object in step (b);
   (d) perforating a second stencil with a predistorted design having a distortion error complementary to that measured in step (c), and
   (e) utilizing said second stencil and said squeegee to print an undistorted design on said object

* * * * *